Feb. 16, 1971 R. G. WILSON 3,563,809

METHOD OF MAKING SEMICONDUCTOR DEVICES WITH ION BEAMS

Filed Aug. 5, 1968 2 Sheets-Sheet 2

Robert G. Wilson,
INVENTOR.
BY.
W Hume McAllister Jr
ATTORNEY.

3,563,809
METHOD OF MAKING SEMICONDUCTOR DEVICES WITH ION BEAMS

Robert G. Wilson, Canoga Park, Calif., assignor to Hughes Aircraft Company, Culver City, Calif., a corporation of Delaware Filed Aug. 5, 1968, Ser. No. 750,080
Int. Cl. H01l 7/54
U.S. Cl. 148—1.5 13 Claims

ABSTRACT OF THE DISCLOSURE

Method of fabricating a semiconductor device in which P-N junctions, protective coatings, and micro-machining operations are all performed in vacuum by means of ion beams, and in which metalization for electrodes and connections may also be applied.

This invention relates to the fabrication of semiconductor devices and equipments. More particularly, the invention relates to methods and apparatus for fabricating discrete semiconductor devices such as diodes and transistors or integrated circuit equipments or the like in which a plurality of active and/or passive components may be disposed on or in a semiconductor substrate.

The manufacture of semiconductor equipments in either discrete or integrated micro-circuitry form is in large part today based upon the process of diffusion. As used herein the term "diffusion" refers to the penetration of a semiconductor crystal lattice structure by impurity atoms under the influence of elevated temperatures but without melting the semiconductor body. The term "impurity" is employed to designate a material which when incorporated into the crystal lattice structure of a semiconductor body establishes a particular type of current conductivity therein. A donor or N-type impurity is one whose atoms contain at least one more valence electron than the atoms of the semiconductor material and hence is capable of contributing or donating electrons for current conduction. An acceptor or P-type impurity is one whose atoms contain at least one less valence electron than the atoms of the semiconductor material and hence is capable of accepting electrons (or contributing "holes") for current conduction.

In diffusion, the migration of the atoms of an impurity substance into the semiconductor body occurs when the impurity material is brought into contact with an exposed surface portion of the semiconductor body whether the impurity material is in the solid, liquid or gaseous phase thereof. However, it is preferred in the industry today to employ gaseous diffusion which means that the semiconductor body is disposed in an atmosphere containing atoms of the impurity to be introduced therein. The rate and extent of migration or penetration of the impurity into the semiconductor body may be controlled as a function of time and temperature, it being preferred to carry out the process at an elevated temperature in order to shorten the processing time as much as possible.

It will be appreciated that it is most usually desired to introduce impurities of one type or another into a portion less than the whole of a given semiconductor body. This is true in the case of a discrete device such as a diode or transistor as well as in the fabrication of a plurality of devices as in integrated micro-circuitry applications. Thus, means must be provided which can effectively prevent or mask against the penetration or diffusion of impurity materials into preselected portions of the semiconductor body. This is commonly achieved by oxidizing surface portions of a body of silicon to form a layer of silicon dioxide thereon, it having been discovered that silicon dioxide is an excellent mask against penetration therethrough by such common doping impurities as boron and arsenic. In order to diffuse the desired impurity into a restricted portion of the semiconductor body it is necessary to provide an opening or window through the oxide to expose the surface of the portion to be doped. It is also quite common to reclose such window by further oxide after completing the diffusion, and in case of certain transistor devices (such as planar transistors) a smaller window is opened in the oxide used to close the initial window so that an impurity of opposite conductivity type to that utilized in the first diffusion may be diffused into a smaller portion of the originally diffused portion.

It will thus be appreciated that in the fabrication of semiconductor apparatus by the diffusion process many distinctly different operations are involved which employ unrelated scientific disciplines. Thus, the diffusion phenomenon itself requires the vaporization of an impurity and the heating of the semiconductor substrate. Should it be desired to change the impurity as in the fabrication of a planar transistor, the diffusion equipment must be purged of the initial impurity vapors and an atmosphere of a new impurity vapor established. (Alternatively, the substrate could be transferred from one diffusion apparatus to another subject to adequate protection against contamination being provided.) It is also necessary to provide for masking against diffusion as indicated above which requires exposing a semiconductor substrate to an oxidizing atmosphere, for example. In moving from mask preparation to diffusion, another transfer of the substrate may be involved or another purging of the apparatus is required followed by the establishment of a new atmosphere. It is also necessary to open "windows" in the mask which is generally preferentially accomplished chemically as by etching silicon dioxide with hydrofluoric acid. To confine the etching action to the prescribed portion of the silicon dioxide mask requires masking the oxide with a photoresist material which is then exposed to a light image, developed and treated so that the oxide is protected by the resist except where removal thereof by the etchant is desired. Obviously, before subjecting the substrate to the diffusion step it is necessary to clean the surface thereof of any photoresist material and the like that may have been required in order to form the mask. One of the last steps required to be performed in fabricating semiconductor devices is the provision of electrical contacts on certain prescribed portions of the device. In many instances this is achieved by vapor-desspositing metal through a mask (which again may be formed of photoresist material). Finally, it is often desirable to provide the device with additional protection against the ambient as by means of glass coatings or layers over the protectice silicon oxide mask. Such protective glassing may be achieved by radio frequency sputtering of glass onto the device surface.

It will thus be appreciated that fabrication processes based on the diffusion mechanism are undesirably complicated and extensive. One is faced with the problems of contamination requiring excessive and ofttimes repeated purification procedures. Mask formation requires wet chemical processing and the use of extremely delicate photolithographic techniques in order to maintain proper alignment and indexing of parts being processed. The necessary movement of the semiconductor substrate from one kind of processing equipment to another imposes severe requirements for indexing in order to maintain alignment.

It is therefore an object of the present invention to provide an improved method for fabricating semiconductor equipment.

A further object of the invention is to provide an improved method for fabricating semiconductor devices and equipments from start to finish without removal from a vacuum system.

Still another object of the invention is to provide an improved method for fabricating semiconductor devices and equipments without the necessity of transferring semiconductor substrates in order to permit sucessively different processing steps thereon.

Still another object of the invention is to provide an improved method for fabricating semiconductor devices and equipments without the necessity of wet chemistry of photolithographic processing.

Yet another object of the invention is to provide an improved method for forming one or more P-N junctions in a semiconductor body, providing the body with a protective passivated surface and with electrical contacts to the desired portions of the semiconductor body without removal or moving of the semiconductor within or from the vacuum.

These and other objects and advantages of the invention may be realized by providing a semiconductor body within an evacuated system and subjecting any selected portion of the semiconductor body to the action of one or more ion beams which may be used to implant conductivity-type-determining impurities (N-type or P-type) in any prescribed portion of the semiconductor body or which may be capable of ion beam micro-machining the semiconductor body or any desired portion thereof or which is capable of providing the semiconductor body with a passivated protected surface. More particularly, a semiconductor body is provided in an evacuated system and selectively subjected to the action of an ion beam or beams capable of establishing N- or P-type conductivity therein as well as ion beams of nitrogen or oxygen to form nitride or oxide protective films (e.g., $Si_3N_4$ or $SiO_2$) thereon, or which may be subjected to an inert ion beam (e.g., argon) for ion beam etching or micromachining the semiconductor body or any parts thereof or thereon such as protective films.

The invention will be described in greater detail with reference to the drawings in which.

Figure 2:
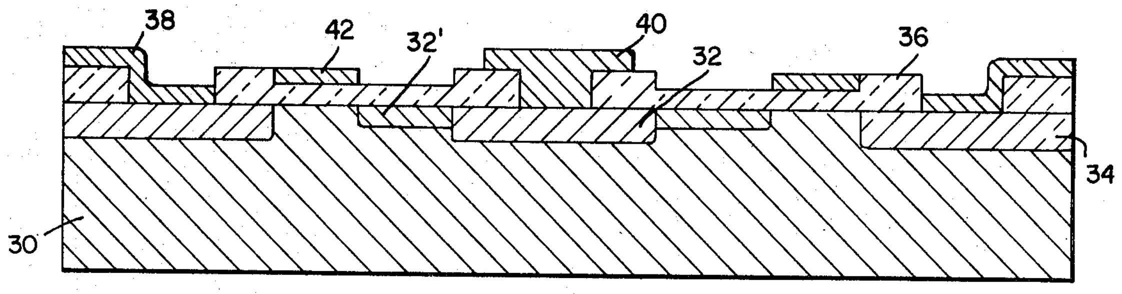
FIG. 2 is an elevational view in section of a semi-conductor body fabricated according to the invention.

Before proceeding with a detailed description of the process of fabricating semiconductor devices according to the invention, a brief explanation of ion beam phenomenon and particularly ion implantation may be helpful. In general, ion implantation refers to a doping process in which a conductivity-type-determining impurity is formed into a beam of energetic ions and directed at a semiconductor body so as to penetrate the semiconductor crystal lattice structure and become implanted therein at some predetermined depth and according to some predetermined pattern. Since ions are electrically charged particles, they are capable of being positioned and controlled as to velocity and direction by means of electric fields, for example. Thus, in contrast to the process of diffusion for doping a semiconductor body wherein there is a supply of atoms capable of establishing the desired type of conductivity which atoms are usually in a vapor state and are not precisely controllable, the impurity atoms in an ion implantation process may be formed into beams of various cross-sectional diameters and shapes. In the diffusion process the impurity atoms "drift" into contact with an exposed surface of a semiconductor body and continue to drift into the semiconductor body in a more or less random fashion. An ion beam on the other hand may be caused to travel in predetermined directions at predetermined velocities much like the electrons in an electron beam. Instead of drifting into the lattice structure of the semiconductor body in random directions, these ions may be made to enter the lattice structure in a predetermined direction and may be positioned where desired therein. Furthermore, the concentration of such impurities in the semiconductor body may be readily controlled and made uniform or graded throughout the implanted region if desired. Thus, by ion implantation a region of given conductivity type and of precise geometry and depth may be established. One of the important advantages of the process is the fact that the semiconductor body itself need not be heated to excessive temperatures (e.g., above 550° C.) which in other doping processes such as diffusion often deleteriously affects the semiconductor and renders precise control of device fabrication tedious and expensive. Furthermore, device "smallness" is limited by the diffusion process because diffusion proceeds equally in all directions in the semiconductor body (i.e., laterally as well as vertically). Such "spreading" does not occur in the ion implantation process except as desired.

There are two other actions of an ion beam which are readily obtainable and controllable and therefore of importance in the process of the invention. One of these is the ability to "machine" or physically remove portions of a bombarded area to some desired depth. Thus, by ion beam machining portions of a semiconductor body or any protective coatings on a surface thereof may be removed to a desired depth simply by bombarding that area with a beam of inert energetic ions.

The third action of an ion beam which may be used to advantage in the fabrication of semiconductor devices is that of chemical reaction with the material of a bombarded substrate so that the surface of the semiconductor substrate may be provided with a passivated or protective coating. Thus, a silicon body may be irradiated with ions of oxygen or nitrogen to form electrically insulating and protective films of silicon dioxide or silicon nitride thereon.

By the use of these three ion beam mechanisms it is possible to place a blank or wafer of semiconductor material in an evacuated chamber and fabricate a number of devices such as P-N diodes or PNP transistors in the apparatus without removal therefrom and also provide such devices with a protective coating such as silicon oxide or silicon nitride. All of this may be accomplished with a single vacuum pump-down, without the necessity of time-consuming atmospheric-purging operations and without the use of wet chemical processes and/or photolithographic techniques. It is possible that the starting blank or wafer of semiconductor material may be intrinsic; that is, undoped and therefore suitable as the support substrate for an integrated circuit wherein the discrete devices formed in the substrate are electrically isolated by the intrinsic (undoped) substrate. Prescribed regions of the substrate may be doped either N or P type and redoped if desired to form single P-N (or N-P) junctions or multiple PNP (or NPN) junctions. Bipolar semiconductor devices as well as field effect devices, particularly of the insulated gate type, may be fabricated by the process of the invention.

Figure 1:
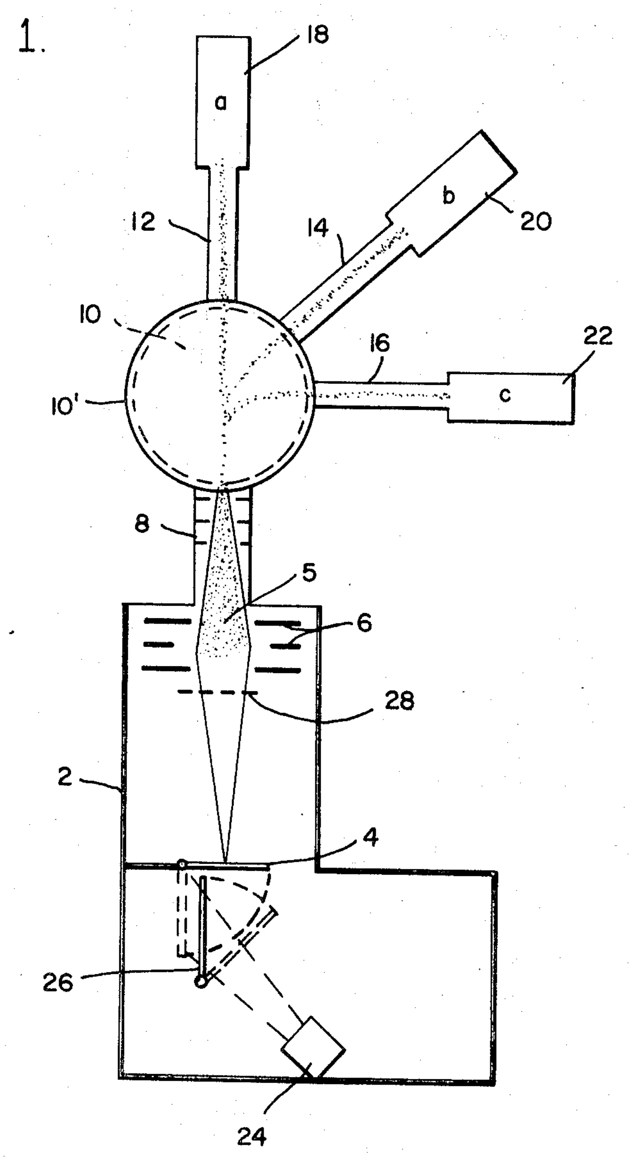
FIG. 1 is a diagrammatic sketch of apparatus suitable for carrying out the process steps of the invention.

Referring now to the drawings and FIG. 1 in particular, apparatus suitable for fabricating semiconductor devices according to the invention is shown. It will be understood that while the fabrication of a single or discrete device is described herein, fabrication of a plurality of devices upon a single semiconductor substrate is also within the scope of the invention, it being merely necessary to dice such a wafer upon the conclusion of device fabrication in order to obtain discrete devices if desired. Shown in FIG. 1 is apparatus suitable for selectively subjecting a semiconductor body to the action of several ion beams in vacuum. Disposed in an evacuated container 2 is a semiconductor substrate 4 which, for purposes of illustration and description, is shown having a principal surface disposed substantially normal to the principal axis of an ion beam 5 entering the container 2 from the top thereof. It will be understood that the container 2 is adapted to be evacuated as by a connection (not shown) to suitable vacuum pumping apparatus (also not shown). Disposed near the top of the container 2 are a plurality of lens members 6 adapted to have different electrical potentials applied thereto to permit an ion beam to be focused on the substrate 4.

The container 2 is connected by a conduit 8 to a magnetic mass separation chamber 10. This chamber 10 is likewise evacuated and is provided with conduits or ports 12, 14 and 16 to several different ion beam sources 18, 20 and 22, respectively. The magnetic mass separation chamber 10 is provided with an exterior circular magnetic member 10′ whose magnetic field strength may be controllably varied so as to act upon the ion beams entering the magnetic mass separation chamber 10 in discretely different fashions. The purpose of the magnetic mass separation chamber is to permit selection of an ion beam of substantially only one species particularly in the case where it is desired to dope a semiconductor substrate by ion implantation. In the case of an ion beam for micro-machining purposes, the production of a substantially pure species beam is not necessary and such a beam of an inert species does not need to be mass-separated. For ion beams of conductivity-type-determining impurity materials or of such reactive materials as oxygen or nitrogen, purity of such beams is highly desirable. Hence, these beams would be subject to the action of the magnetic mass separator. It will be understood that the disposition of the various ion beam sources is exemplary only and may be varied and adjusted at will. Also, it will be appreciated that a single ion source may be employed and provided with different charges to produce the various ion beam species for the various functions desired.

The ion sources 18, 20 and 22 may be of the type shown and described in the copending application, S.N. 640,441 filed by R. G. Wilson, G. R. Brewer and D. M. Jamba May 16, 1967 and assigned to the instant assignee. The ion source 18 may be of the type adapted to gererate what may be referred to as a machining ion beam which is intended to perform such mechanical functions such as machining or cutting or etching a workpiece such as the substrate 4 or portions thereof. A suitable ion species for the purpose of this beam function would be argon. The ion beam source 20 may be adapted to generate what may be referred to as a chemical reaction ion beam for the purpose of directing a beam of ions against the substrate member so as to react therewith and to form passivating and/or electrically insulating compounds in situ such as silicion dioxide or silicon nitride. A suitable ion species for the purpose of this beam may be oxygen or nitrogen. The ion beam source 22 may be adapted to generate what may be referred to as an electronic reaction ion beam to serve the purpose of bombarding the substrate 4 so as to introduce into desired portions thereof ions capable of establishing a desired type of electrical conductivity (e.g., either P-type or N-type conductivity). A suitable ion species for this purpose may be boron (for P-type doping of such elemental semiconductors as germanium and silicon, for example) or phosphorous (for N-type doping of such elemental semiconductors as germanium and silicon, for example). If more than one ion species is not desired to be generated in one source, an additional source for generating the different species may be provided. Thus, an additional source (not shown) for generating a P-type ion beam distinct from the source for generating an N-type ion beam may be provided although it is possible to utilize the same source apparatus for generating the different types of beams desired.

Disposed in the bottom of the container 2 is a metal vapor source 24 which is adapted to form a beam or vapor of metal atoms suitable for use as the connections or electrodes on a semiconductor device. As shown, the metal vapor source 24 is provided to direct the metal vapor toward the substrate in a direction which is different from the direction of the ion beams. This is to permit the metal vapor beam and the ion beams to be more or less isolated from each other and to minimize any interaction. In order to permit the surface of the semiconductor body or substrate 4 to receive metal from the vapor source, a substrate 4 is mounted so as to permit the substrate to be pivoted from a position more or less perpendicular with respect to the axis of the ion beams to a position parallel to this axis and at an angle with respect to the axis of the metal vapor beam. With the substrate 4 in the appropriate position, the entire surface thereof may be provided with a metal coating after which selected portions of this metal coating may be removed by the ion beam micro-machining technique to leave the desired metallic pattern. In instances where it is not desired to coat the entire surface of the semiconductor body or substrate 4 with metal, a mask member 26 is provided in the container 2 and adapted to be positioned between the substrate 4 when it is in its metalization position and the metal vapor sources 24. The mask member 26, therefore, serves to intercept portions of the metal beam while permitting other portions to be deposited upon the substrate 4 to the portions desired thereon.

While the invention may be practiced to fabricate any kind of solid state electrical or electronic device particularly of the semiconductor type either bipolar or unipolar, the practice of the method of the invention will be described with respect to the fabrication of an insulated gate field effect transistor such as shown in FIG. 2. In one form, such transistors employ spaced regions termed the "source" and the "drain" with an insulated electrode disposed at least in part over a portion of the space or channel region between the spaced source and drain regions. By means of the electric field established by the insulated gate or control electrode member over this channel region, currents flowing between the source and drain may be modulated and regulated. Such transistors are well known in the operation thereof and will not be further described in detail herein. For a more comprehensive description to such device, reference is made to the text "Field Effect Transistors," edited by J. T. Wallmark and H. Johnson, published by Prentice Hall, Inc., Englewood Cliffs, N.J., 1966. The particular type of field effect transistor shown in FIG. 2 is also described in greater detail in the copending application of R. W. Bower and H. G. Dill, S.N. 631,263, filed Apr. 17, 1967.

The device shown in FIG. 2 comprises, for example, an N-type body 30 of silicon. A circular P-type drain region 32 is disposed in and at an upper surface of the silicon body 30. Symmetrically disposed around and spaced from the drain region 32 is an annular P-type source region 34 which is likewise disposed in and at the same surface of the silicon body 30. The surface on which the source and drain members are disposed is protected by an overlying film 36 of electrically insulating material such as silicon oxide, for example. Through openings in this protective insulating film 36 metallic connections 38 and 40 to the source and drain members, respectively, are provided. Disposed over a portion of the channel region between the source and drain members and electrically insulated from the semiconductor body by the protective insulating film 36 is an annular metallic gate member 42. In accordance with the teachings of the aforementioned application of Bower and Dill, the drain member 32 is provided with a radially extending perimeter portion 32′ which likewise is of P-type conductivity and extends radially at least until its outer most edge is in line with the inner perimeter of the annular gate member 42. The purpose of this structure is to permit the gate member 42 to be disposed completely over the channel region between source and drain members but without overlapping either of the source and drain regions. Such a structure is achieved by first forming the gate member 42 and then forming the extension 32' of the drain member by ion implantation using the metallic gate member 42 as a mask against implantation.

Figure 3:
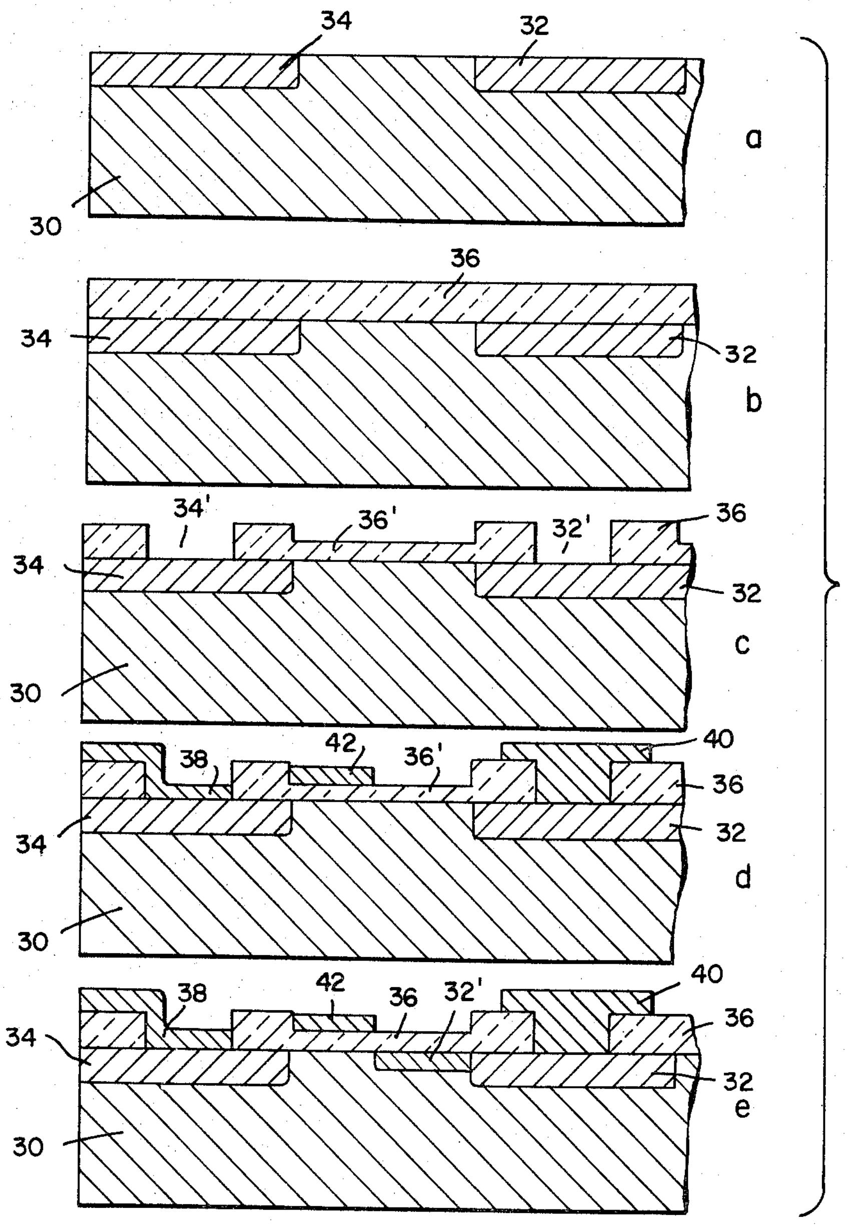
FIGS. 3(*a*) through 3(*e*) are cross-sectional, elevational views of the semiconductor body shown in FIG. 2 at various succeeding processing stages in the fabrication thereof according to the invention.

Referring now to FIGS. 3(*a*) through 3(*e*), the processing of a semiconductor substrate according to the invention is illustrated therein. The semiconductor substrate 30 which may be of silicon, for example, and of either P-type or N-type conductivity, for example, is placed in the ion reaction chamber 2 which is then evacuated. It is also possible that the semiconductor substrates be of highly pure semiconductor material whereby the substrate itself may serve as an electrically isolating support member for an electrical or electronic device or circuit which will be formed thereon and/or therein. For the purpose of explaining the present invention, it will be assumed that the semiconductor substrate 30 is of N-type conductivity and that it is desired to fabricate therefrom an insulated gate field effect transistor as shown in FIG. 2.

Upon evacuation of the reaction chamber 2 and with the substrate 30 in position to be irradiated or scanned by an ion beam according to the invention, the first step may be the provision of the source and drain regions 34 and 32 of a desired type of conductivity (e.g., P-type) and electrical resisitivity as shown in FIG. 3(*a*). Such P-type regions may be formed in the semiconductor substrate member 4 by implanting in this region ions of an P-type conductivity-type-determining impurity material. Thus, for example, the ion source 22 may be activated so as to generate a beam of ions of a P-type impurity such as boron which is then caused to scan or impinge upon the surface of the silicon body 30 whereat it is desired to form the P-type source and drain regions 34 and 32. By adjusting the energy and the time of irradiation of the substrate with such an ion beam, it is possible to form source and drain regions of any desired depth and concentration.

The next step may be the provision of an electrically insulating and passivated surface layer 36 on a surface of the semiconductor body 30 as shown in FIG. 3(*b*). This may be achieved by activating the ion source 20, for example, and generating a beam of either nitrogen or oxygen ions and causing said beam to scan the surface of the semiconductor substrate 4 whereupon the bombarding ions react with the substrate material so as to form a dielectric layer 36 of silicon dioxide or silicon nitride, for example.

Upon the attainment of satisfactory passivating film 36 of desired thickness, the next step may be the provision of prescribed openings in this film as shown in FIG. 3(*c*) so as to permit further treatment of discrete portions of the semiconductor substrate 30. In order to take advantage of the masking properties of the passivating film 36 against ion implantation, the film may be initially made relatively as shown in FIG. 3(*b*). However, a film of such thickness over the channel region may be undesirable for several reasons, the most important of which may be the lack of effective control or modulation of the channel region by the electric field established by the gate electrode if the insulating film is too thick, as well as the inability to extend the drain region over the gate by ion implantation through thhe portions of the insulating film 36 over the channel region. Hence, in FIG. 3(*c*) the passivating layer 36 is subjected to ion beam machining to different extents. Thus, the portion of the passivating layer 36 over the channel region between the source and drain has a predetermined amount of the dielectric material removed therefrom so as to leave a thin film 36' of dielectric material still covering the surface of the substrate member 30 which will serve as the insulation for the gate electrode member. At the same time, openings 34' and 32' to the source and drain regions 34 and 32 may be provided in the dielectric film 36 whereby the surface of the silicon substrate is exposed within said openings in order to permit electrical connections to be provided therethrough to the source and drain regions. Such machining or removal of selected areas and amounts of the pretective insulating layer 36 may be achieved by activating the ion source 18 to generate a beam of argon ions which is caused to bombard and/or scan the preselected areas of the protective insulating layer which it is desired to remove. The removal of the desired amounts of the insulating layer 36 may be determined by adjusting the time and/or energy of ion beam irradiation.

At this point the silicon substrate member 30 is pivoted so that the surface which has heretofore been subject to ion beam processing is adapted for exposure to the metalization vapor beam from the vapor source 24. In order to insure precise positioning of the metalization for the gate and connecting electrode members, a mask member 26 having openings therein corresponding to the desired positions for metalization is inserted between the metalization vapor source 24 and the substrate member 30. With reference to FIG. 3(*d*), a metal such as aluminum, for example, may then be vapor deposited in the openings 32' and 34' to the drain and source regions, respectively, and the annular gate electrode member 42 may likewise be formed in position over the channel region between the source and drain regions on the thin insulating layer 36'. After the proper degree of metalization has been obtained, the metalization vapor source 24 may be deactivated and the substrate may be returned to its initial position for further processing by one or more of the ion beams as may be desired.

The final step is providing the extension of the drain region 32 over to the edge of the gate member 42. To this end the ion source 22 may again be activated so as to generate a beam of ions of a P-type impurity such as boron, for example, which is caused to scan or impinge upon the thin insulating portion 36' of the insulating film 36 between the gate member 42 and the drain region 32. It is possible to implant such conductivity-type-determining impurity ions in the semiconductor member 30 through the insulating film 36' while taking advantage of the masking properties of the metallic gate member 42 and the adjacent thicker portions of the insulating film 36. This permits the establishment of the gate member 42 precisely over the channel region between the source and drain without any overlap. For this purpose it is particularly advantageous to form the gate member 42 prior to extending the drain region since it is the edge of the gate member which will effectively define the maximum extent of the extended portion of the drain region.

At this point the fabrication of an insulated gate field effect transistor is complete and the evacuation chamber 2 may be opened and the device removed. It will be appreciated that complete fabrication of the device has been achieved without removing the device from start to finish from the vacuum and without the necessity of any wet chemical processing or tedious, time-consuming vacuum pump-downs. It will be appreciated that many variations in alterations in the various processes may be practiced without departing from the spirit of the invention. Thus, it is not necessary to apply the metalization for the gate electrode or for connection purposes to the device in the ion processing apparatus. Thus, once the desired regions of different conductivity type have been established in the semiconductor body and the surface of the semiconductor body has been provided with a protective insulating film (particluarly over the junctions between regions of different conductivity) and the openings through this film have been provided to permit electrical connections to the underlying regions, the device has been substantially fabricated except for making the "wire" or other metallic connections to the regions. Though the device can be removed from the ion beam processing apparatus and the necessary electrical connections or metalization performed later, the active parts of the device are at all times protected so that removal from the vacuum will have no deleterious effects on the device. It will also be appreciated that with respect to the insulated gate field effect transistor whose fabrication has been described herein, that the metalization for the various connections and the gate electrode may have been provided by the last step in the sequence of processing if it is not important or desirable to utilize the gate electrode member 42 as a mask during the implantation of the extended drain region.

Irradiation of the substrate surface, particularly discrete portions thereof, may be achieved by one of two techniques. A focused ion beam may be deflected in orthogonally related directions like an electron beam in a cathode ray tube so as to scan any selected portion of the substrate surface in accordance with deflection signals developed under the control of a computer and in accordance with some predetermined program. The computer may also program the operation of the various ion beams to achieve the desired functions. Alternatively, an ion beam may be generated and caused to impinge on the desired portions of the substrate surface by means of a mask 28 as shown in FIG. 1 interposed between the substrate and the ion beam source. Such masks are often called "models" because they may be conveniently many times larger in size than the corresponding portion of the substrate surface. This is possible since the mask or model may be placed "up stream" in the ion beam where the cross-sectional dimensions are larger than the cross-sectional dimensions of the beam at the point of focus on the substrate. The advantage of being able to employ large scale masks (that is, large scale with respect to the size of the part in fabrication) will be readily appreciated since the tolerances in mask-making are relaxed considerably.

It will also be appreciated that the method of the invention may be used to fabricate less complex devices than the insulated gate field effect transistor shown and described herein. It will be readily apparent that the P-N diode structures may be provided according to the invention protected with an insulating film, and such a structure is in part shown in FIG. 3(*c*). It will also be appreciated that a bipolar transistor structure can readily be fabricated by implanting, for example, ions of an N-type impurity such as phosphorous in the P-type impurity implanted regions initially formed in the N-type substrate member so that the resulting structure is an NPN transistor configuration.

The present invention lends itself admirably for use with a technique described in a thesis by M. Bernheim entitled "Application de l'Optique Ionique au micro usinage," Faculte des Sciences, Universite de Paris (1966). In this technique a model of the device or circuit to be fabricated according to the techniques of the invention is provided in the ion implantation apparatus as suggested hereinbefore. For complicated devices or arrays thereof a series of models, one for each required step, for example, may be employed. Provided within the apparatus is a phosphor display screen whereby secondary electrons emitted from the substrate surface may be accelerated and focused on the display screen with a magnification of up to 200, for example, thus allowing one to observe the process and compare the substrate surface with that of the model for registration purposes.

What is claimed is:

1. The method of fabricating a semiconductor device comprising:

(a) providing a semiconductor body in a vacuum;
(b) establishing at least one region of a predetermined type of conductivity in said semiconductor body by bombarding said region with ions of a conductivity-type-determining impurity;
(c) providing portions of the surface of said semiconductor body adjacent said region with a protective layer of electrically insulating material by irradiating said portions of said surface with a beam of ions of a material with which the material of said semiconductor body reacts to form an electrically insulating compound therewith;
(d) and removing portions of said protective layer by bombarding said portions with ions of an electrically inert material.

2. The invention according to claim 1 wherein said protective layer of electrically insulating material is formed by irradiating said portions of said surface with ions selected from the group consisting of oxygen and nitrogen.

3. The invention according to claim 1 wherein said semiconductor body is silicon and said protective layer is a compound selected from the group consisting of silicon oxide and silicon nitride formed by irradiating said portions of said surface with ions selected from the group consisting of oxygen and nitrogen, respectively.

4. The invention according to claim 1 wherein said portions of said protective layer are removed by bombarding said portions with argon ions.

5. The invention according to claim 1 wherein said protective layer of electrically insulating material is formed by irradiating said portions of said surface with ions of a material selected from the group consisting of oxygen and nitrogen, and said portions of said protective layer are removed by bombarding said portions with argon ions.

6. The method of fabricating a semiconductor device comprising:

(a) providing a semiconductor body in a vacuum;
(b) establishing at least one region of a predetermined type of conductivity in said semiconductor body by bombarding said region with ions of a conductivity-type-determining impurity;
(c) providing portions of the surface of said semiconductor body adjacent said region with a protective layer of electrically insulating material by irradiating said portions of said surface with a beam of ions of a material with which the material of said semiconductor body reacts to form an electrically insulating compound therewith;
(d) and providing an opening through said protective layer to expose at least said region in said semiconductor body by bombarding a portion of said protective layer with ions of an electrically inert material.

7. The method of fabricating a semiconductor device comprising:

(a) providing a semiconductor body in a vacuum;
(b) establishing at least one region of a predetermined type of conductivity in said semiconductor body by bombarding said region with ions of a conductivity-type-determining impurity;
(c) providing portions of the surface of said semiconductor body adjacent said region with a protective layer of electrically insulating material by irradiating said portions of said surface with a beam of ions of a material with which the material of said semiconductor body reacts to form an electrically insulating compound therewith;
(d) and removing at least in part portions of said protective layer to a predetermined depth less than the whole depth thereof by bombarding said portions with ions of an electrically inert material.

8. The method of fabricating a semiconductor device comprising:

(a) providing a semiconductor body having a first type of conductivity in a vacuum;
(b) establishing the opposite type of conductivity to said first type in at least one region in said semiconductor body by bombarding said region with ions of an impurity capable of establishing said opposite type of conductivity;
(c) providing portions of the surface of said semiconductor body adjacent said region with a protective layer of electrically insulating material by irradiating said portions of said surface with a beam of ions of a material with which the material of said semiconductor body reacts to form an electrically insulating compound therein;

(d) and removing portions of said protective layer by bombarding said portions with ions of an electrically inert material.

9. The method of fabricating a semiconductor device comprising:

(a) providing a body of intrinsic semiconductor material in a vacuum;

(b) establishing at least one region of a first type of conductivity in said semiconductor body by bombarding said region with ions of an impurity capable of establishing said first type of conductivity;

(c) establishing in a portion less than the whole of said region the opposite type of conductivity to said first type by bombarding said portion of said region with ions of an impurity capable of establishing said opposite type of conductivity;

(d) providing portions of the surface of said semiconductor body adjacent said region with a protective layer of electrically insulating material by irradiating said portions of said surface with a beam of ions of a material with which the material of said semiconductor body reacts to form an electrically insulating compound therein;

(e) and removing portions of said protective layer by bombarding said portions with ions of an electrically inert material.

10. The method of fabricating a semiconductor device comprising:

(a) providing a semiconductor body of a first type of conductivity in a vacuum;

(b) establishing at least one region of the opposite type of conductivity to said first type in said semiconductor body by bombarding said region with ions of an impurity capable of establishing said opposite type of conductivity;

(c) establishing in a portion less than the whole of said region said first type of conductivity by bombarding said portion with ions of an impurity capable of establishing said first type of conductivity;

(d) providing portions of the surface of said semiconductor body adjacent said region with a protective layer of electrically insulating material by irradiating said portions of said surface with a beam of ions of a material with which the material of said semiconductor body reacts to form an electrically insulating compound therewith;

(e) and removing portions of said protective layer by bombarding said portions with ions of an electrically inert material.

11. The method of fabricating a semiconductor device comprising:

(a) providing a semiconductor body of a first type of conductivity in a vacuum;

(b) establishing a pair of spaced regions of the opposite type of conductivity to said first type in said semiconductor body and adjacent a common surface thereof by bombarding said regions with ions of an impurity capable of establishing said opposite type of conductivity;

(c) providing portions of the surface of said semiconductor body adjacent said pair of spaced regions with a protective layer of electrically insulating material by irradiating said portions of said surface with a beam of ions of a material with which the material of said semiconductor body reacts to form an electrically insulating compound therewith;

(d) removing portions of said protective layer by bombarding said portions with ions of an electrically inert material;

(e) and providing a control electrode member on the portion of said protective layer of electrically insulating material between said pair of spaced regions.

12. The invention according to claim 11 wherein the portion of said protective layer of electrically insulating material on which said control electrode member is provided is made thinner than the remaining portions of said protective layer by bombarding said portion of said protective layer with ions of an electrically inert material prior to providing said control electrode on said portion.

13. The invention according to claim 11 wherein said control electrode member and electrical connections to said pair of spaced regions are provided by depositing metal on the portion of said protective layer between said pair of spaced regions and in openings through said protective layer through which surface portions of said pair of spaced regions are exposed.

References Cited

UNITED STATES PATENTS

| | | | |
|---|---|---|---|
| 3,390,019 | 6/1968 | Manchester | 148—1.5 |
| 3,472,712 | 10/1969 | Bower | 148—187 |

L. DEWAYNE RUTLEDGE, Primary Examiner

R. A. LESTER, Assistant Examiner

U.S. Cl. X.R.

29—576, 578; 117—93.3; 148—186, 187